United States Patent
Morich et al.

(10) Patent No.: US 7,403,004 B2
(45) Date of Patent: Jul. 22, 2008

(54) B1 FIELD CONTROL IN MAGNETIC RESONANCE IMAGING

(75) Inventors: Michael A. Morich, Mentor, OH (US); Gordon D. DeMeester, Wickliffe, OH (US); Zhiyong Zhai, Cleveland, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 84 days.

(21) Appl. No.: 10/595,582

(22) PCT Filed: Oct. 7, 2004

(86) PCT No.: PCT/IB2004/052020

§ 371 (c)(1),
(2), (4) Date: Apr. 28, 2006

(87) PCT Pub. No.: WO2005/043182

PCT Pub. Date: May 12, 2005

(65) Prior Publication Data

US 2007/0108976 A1    May 17, 2007

Related U.S. Application Data

(60) Provisional application No. 60/517,224, filed on Oct. 31, 2003.

(51) Int. Cl.
*G01V 3/00* (2006.01)
(52) U.S. Cl. .................................................. 324/309
(58) Field of Classification Search ......... 324/300–322; 600/410–435
See application file for complete search history.

(56) References Cited

U.S. PATENT DOCUMENTS

| 4,307,344 | A | * | 12/1981 | Walters | .......... 324/307 |
| 5,914,599 | A | | 6/1999 | Sharp | |
| 6,252,403 | B1 | | 6/2001 | Alsop | |
| 6,812,698 | B1 | | 11/2004 | Tsukamoto | |
| 6,995,559 | B2 | * | 2/2006 | Agilandam et al. | ...... 324/309 |

OTHER PUBLICATIONS

Clare, S., et al.; Compensating for B1 inhomogeneity using active transmit power modulation; 2001; MRM; 19:1349-1352.
DeDeene, Y., et al.; Artefacts in multi-echo T2 imaging for high-precision gel dosimetry: II. Analysis of B1-field inhomogeneity; 2000; Phys. Med. Biol.;45:1825-1839.

(Continued)

*Primary Examiner*—Brij B Shrivastav
*Assistant Examiner*—Dixomara Vargas

(57) ABSTRACT

Multi-slice magnetic resonance imaging of a region of interest of an imaging subject (16) is performed using a radio frequency coil (40) arranged to generate a $B_1$ magnetic field in the region of interest. One or more processors (44, 82, 88, 110) determine a B1 field value for each slice that is representative of the B1 field over a selected area of the slice, accounting for subject effects on the Bl field, and determine an adjusted per-slice radio frequency excitation for each slice that adjusts the $B_1$ field value for the slice to a selected value. A magnetic resonance imaging system (10, 44, 46, 50, 52) acquires magnetic resonance imaging data for each slice using the adjusted per-slice radio frequency excitation for that slice. A reconstruction processor (58) reconstructs the acquired magnetic resonance imaging data into a reconstructed image representation.

20 Claims, 5 Drawing Sheets

OTHER PUBLICATIONS

Figure 1:
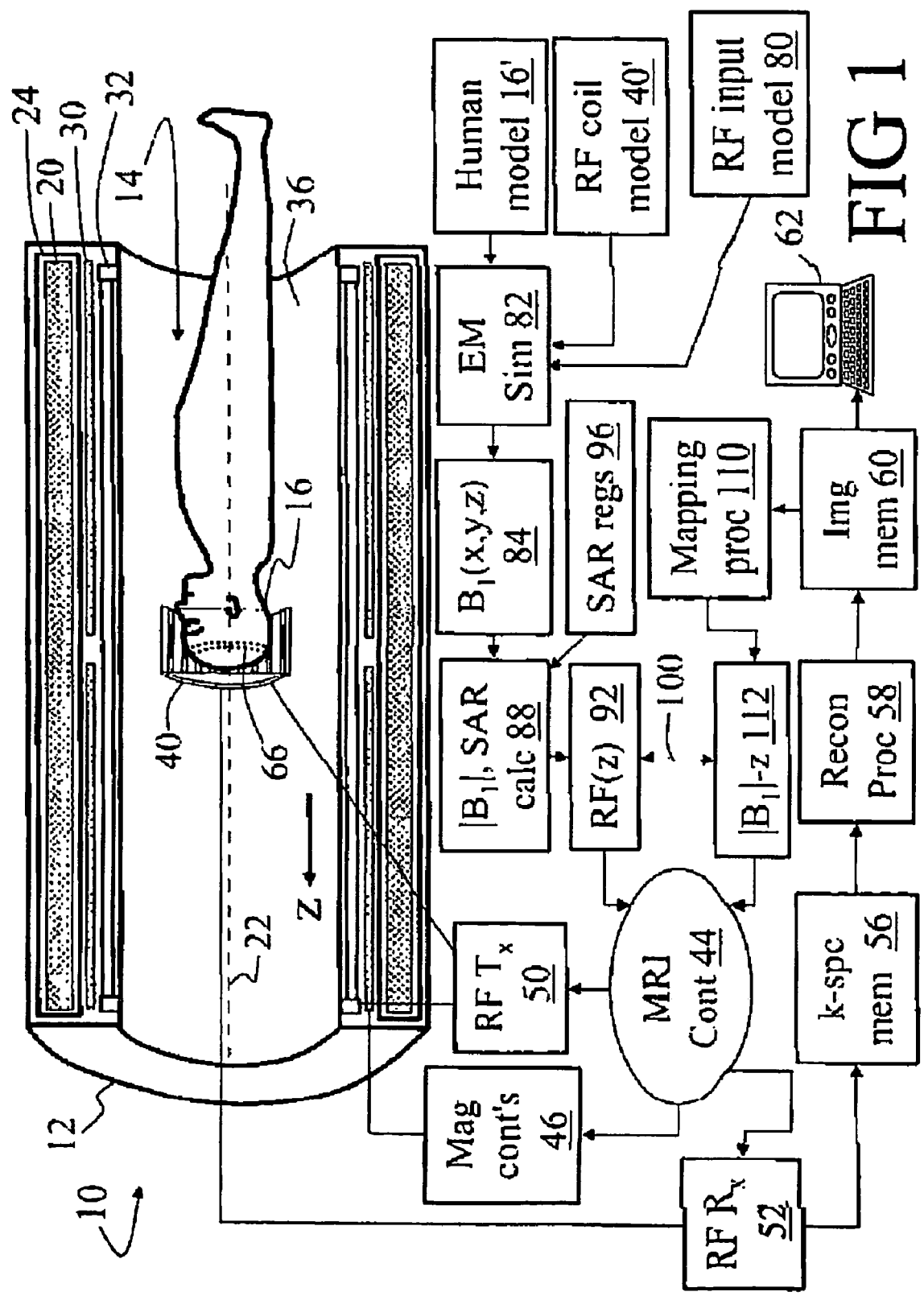

DeDeene, Y., et al., Validation of MR-Based Polymer Gel Dosimetry as a Preclinical Three-Dimensional Verification Tool in Conformal Radiotherapy; 2000; MRM; 43:116-125.

Ibrahim, T.S., et al., Effect of RF coil excitation on field inhomogeneity at ultra high fields: A field optimized TEM resonator, 2001; MRI; 19:1339-1347.

Kingsley, P.B., et al.; Correction of errors caused by imperfect inverion pulses in MR imaging measurement of T1 relaxation times; 1998; MRI; 16(9)1049-1055.

Rosenfeld, D., et al.; Design of selective adiabatic inversion pulses using the adiabatic condition; 1997; J. Mag. Reson.; 129:115-124.

Cohen, M.S., et al.; Rapid and effective correction of RF inhomogeneity for high field magnetic resonance imaging; http://airto.loni.ucla.edu/BMCweb/BMC BIOS/MarkCohen/Papers/EQ/; in Human Brain Mapping.

Canada National Research Counsil "RF Inhomogeneity Compensation" http://ibd.nrc-cnrc.gc.ca/ibd_external/tech_commercialization/1_rf_inhomogeneity_comp_e.html.

* cited by examiner

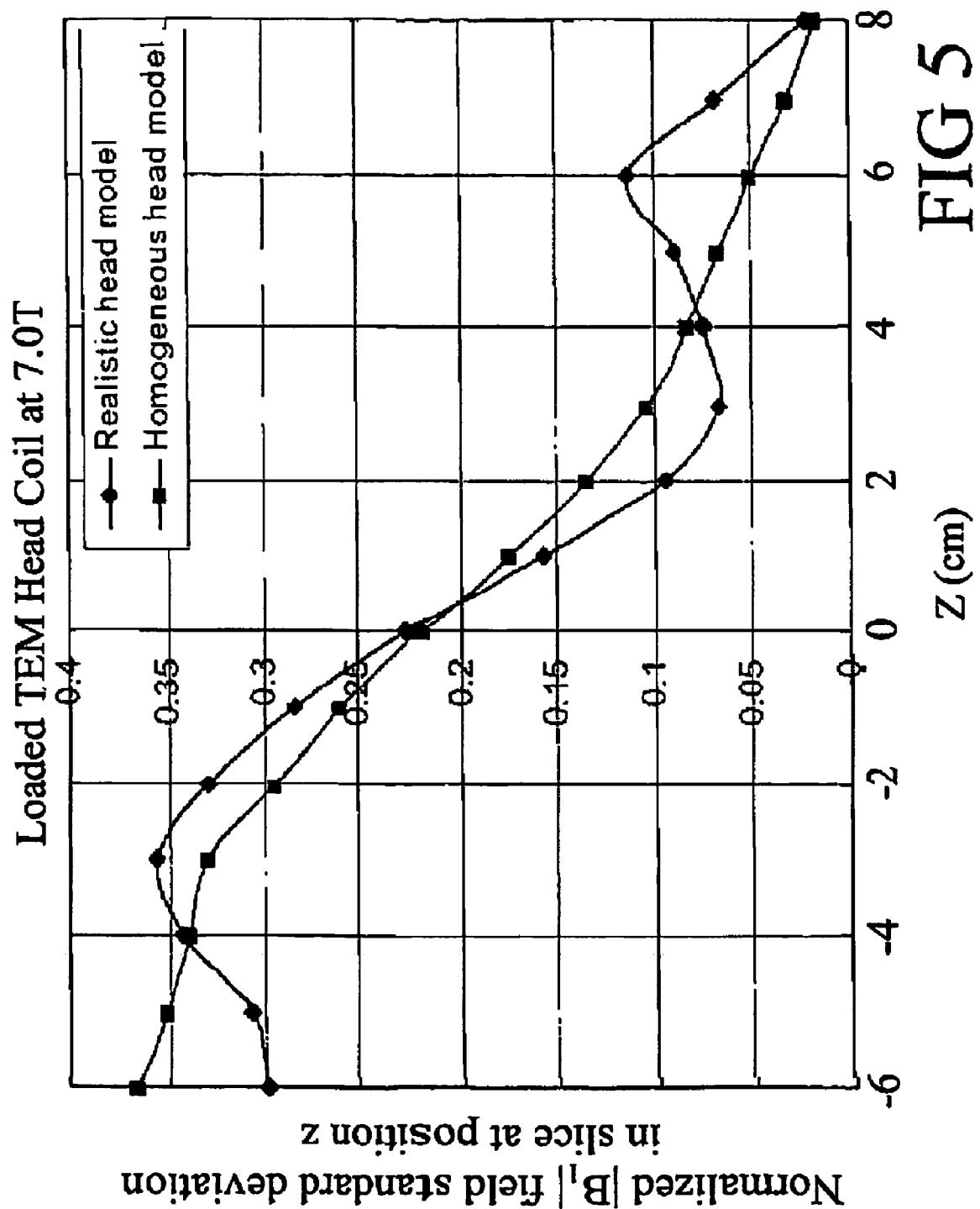

B1 FIELD CONTROL IN MAGNETIC RESONANCE IMAGING

CROSS REFERENCE TO RELATED APPLICATIONS

This application claims the benefit of U.S. provisional application Ser. No. 60/517,224 filed Oct. 31, 2003, which is incorporated herein by reference.

The following relates to the magnetic resonance arts. It finds particular application in magnetic resonance imaging, and will be described with particular reference thereto. However, it also finds application in other magnetic resonance applications such as magnetic resonance spectroscopy.

As the flip angle of spins relates to the B1 magnetic field, it is desirable that the $B_1$ magnetic field produced by radio frequency transmissions during magnetic resonance imaging be spatially uniform, both within an image slice, and also across multiple image slices. At relatively low resonance frequencies such as 64 MHz corresponding to a main ($B_o$) magnetic field of about 1.5 T, modifications of the $B_1$ field by conductive and dielectric characteristics of the imaging subject are typically negligible. However, for frequencies of 128 MHz or higher ($B_o \gtrsim \sim 3.0$ T for $^1$H), conductive and dielectric characteristics of the imaging subject substantially affect the $B_1$ field uniformity and cause the field to be more non-uniform than it would be without subject effects.

To partly mitigate the effects of $B_1$ field non-uniformity, an adiabatic radio frequency pulse packet can be employed. The adiabatic radio frequency pulse packet reduces the effect of spatial variations in radio frequency field strength to produce a more uniform flip angle. However, adiabatic radio frequency pulse packets have certain disadvantages, including being difficult to refocus and employing a higher radio frequency power levels resulting in higher specific absorption rate (SAR) values.

An approach for partly mitigating the effects of $B_1$ field non-uniformity across multiple slices is disclosed in Clare et al., "Compensating for $B_1$ inhomogeneity using active transmit power modulation," *Magnetic Resonance Imaging* vol. 19, pp. 1349-52 (2001). To improve uniformity of flip angles across multiple axial slices, Clare et al. measured the axial $B_1$ field dependence along the central axis of an empty birdcage radio frequency coil using a magnetic flux probe to produce a lookup table of radio frequency excitation intensity correction values. Using the lookup table, the radio frequency power input was adjusted on a per-slice basis for each acquired slice to compensate for the axial dependence of the $B_1$ field. Measurements at 128 MHz (3.0 T) for homogeneous gel-filled cylindrical phantoms and human heads using this input power compensation produced a substantial axial uniformity improvement in flip angle along the central axis of the coil. However, substantial in-slice non-uniformity remained, and it was recognized that the axial correction along the central axis is unable to compensate for such in-plane $B_1$ field variation.

At higher frequencies, the $B_1$ fields in the human body are known to differ substantially from those measured in an empty or lightly loaded RF coil. Moreover, because the $B_1$ field variation across slices is expected to depend upon the in-slice coordinate and effects of the subject, a calibration generated along the central axis of an empty coil may be largely ineffective for compensating variation of the $B_1$ field at radial positions away from the central axis along which the axial flux probe calibration was acquired.

The present invention contemplates an improved apparatus and method that overcomes the aforementioned limitations and others.

According to one aspect, a magnetic resonance imaging method is provided for performing multi-slice magnetic resonance imaging of a region of interest of an imaging subject using a radio frequency coil arranged to generate a $B_1$ magnetic field in the region of interest. A per-slice $B_1$ field value is determined for each slice that is representative of the $B_1$ field over a selected area of the slice. An adjusted per-slice radio frequency excitation is determined for each slice that adjusts the $B_1$ field value for the slice to a selected value. Magnetic resonance imaging data are acquired for each slice using the adjusted per-slice radio frequency excitation for that slice. The acquired magnetic resonance imaging data are reconstructed into a reconstructed image representation.

According to another aspect, a magnetic resonance imaging apparatus is disclosed for performing multi-slice magnetic resonance imaging of a region of interest of an imaging subject. A radio frequency coil is arranged to generate a $B_1$ magnetic field in the region of interest. A means is provided for determining a per-slice $B_1$ field value for each slice that is representative of the $B_1$ field over a selected area of the slice. A means is provided for determining an adjusted per-slice radio frequency excitation for each slice that adjusts the $B_1$ field value for the slice to a selected value. A means is provided for acquiring magnetic resonance imaging data for each slice using the adjusted per-slice radio frequency excitation for that slice. A means is provided for reconstructing the acquired magnetic resonance imaging data into a reconstructed image representation.

One advantage resides in providing a radio frequency power input correction on a per-slice basis that accounts for in-slice variation of the $B_1$ field.

Another advantage resides in providing $B_1$ field correction that accounts for spatially varying conductance and dielectric properties of the imaging subject.

Another advantage resides in providing $B_1$ field correction in combination with determination of peak and average specific absorption rate (SAR) values to optimize the $B_1$ field for both uniformity and intensity while ensuring the SAR remains within regulatory limits.

Yet another advantage resides in providing a per-slice $B_1$ field correction based on a simulation of the $B_1$ field over an area of interest of the slice, where the simulation is performed using a nonhomogeneous model of at least a region of interest of the imaging subject.

Still yet another advantage resides in calibrating the radio frequency power input based on in situ measurement of the $B_1$ field over an area of interest of the slice with the imaging subject or with a compartmentalized non-homogeneous phantom load.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 shows a magnetic resonance imaging system including a per-slice calibration of radio frequency excitation.

Figure 2B:
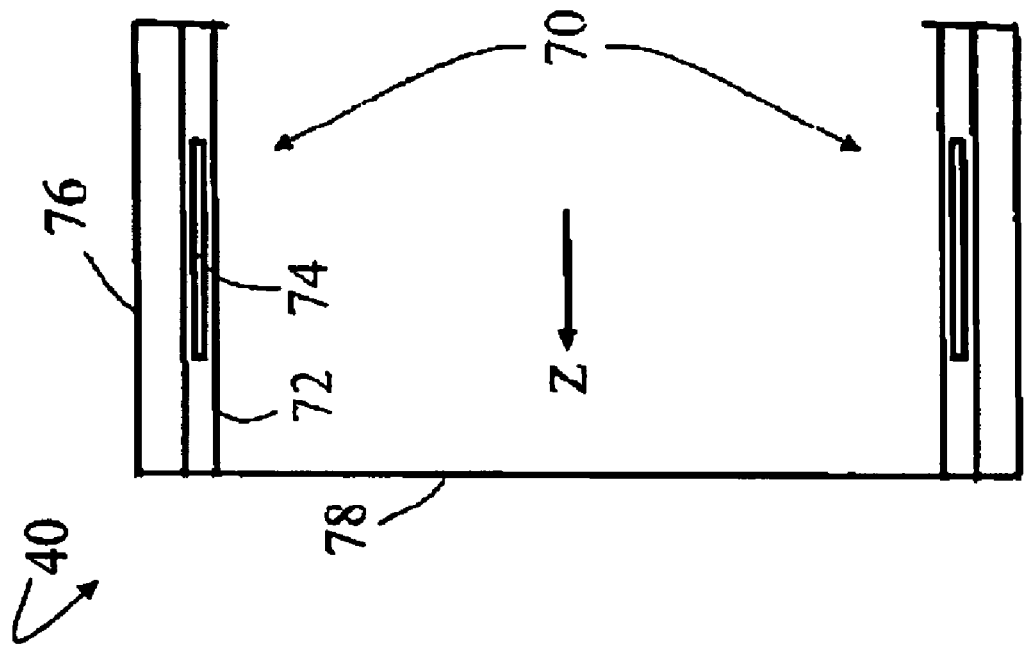
Figure 2A:
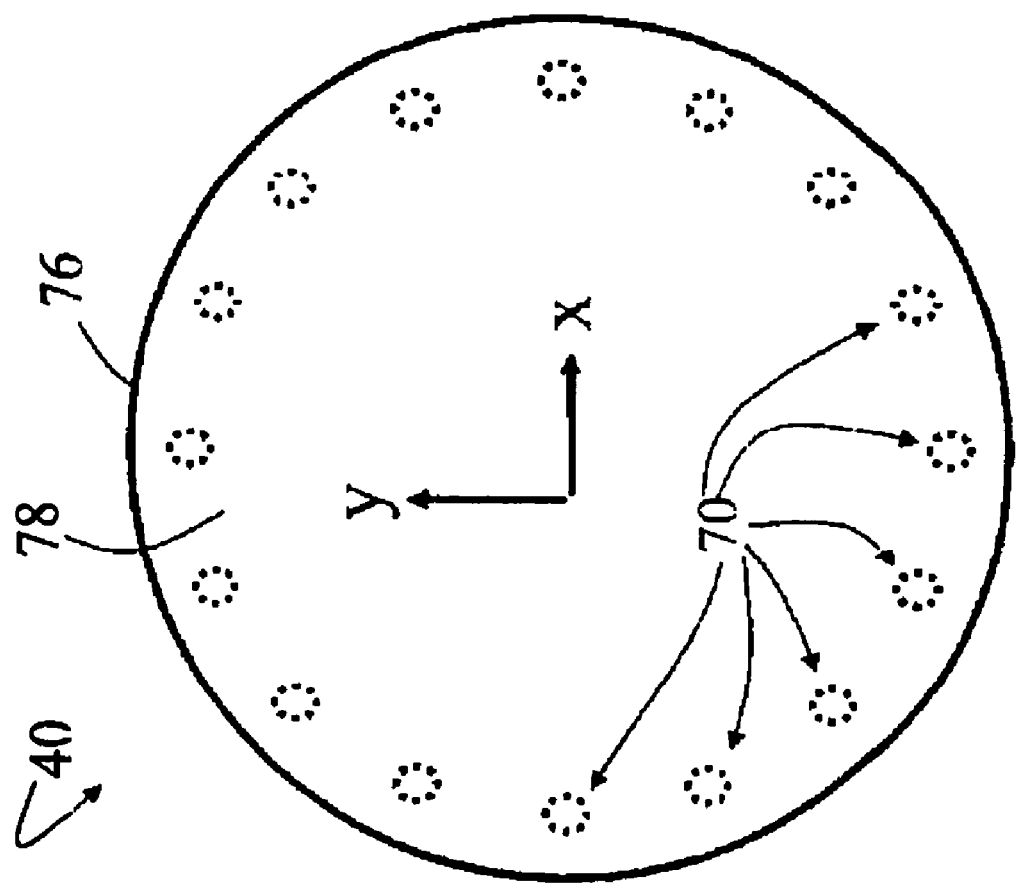

FIGS. 2A and 2B show a top view and a side section, respectively of the TEM head coil of FIG. 1. In the top view of FIG. 2A, the rungs are shown in phantom. The side section of FIG. 2B is taken along a plane passing through two maximally spaced-apart rungs.

Figure 3A:
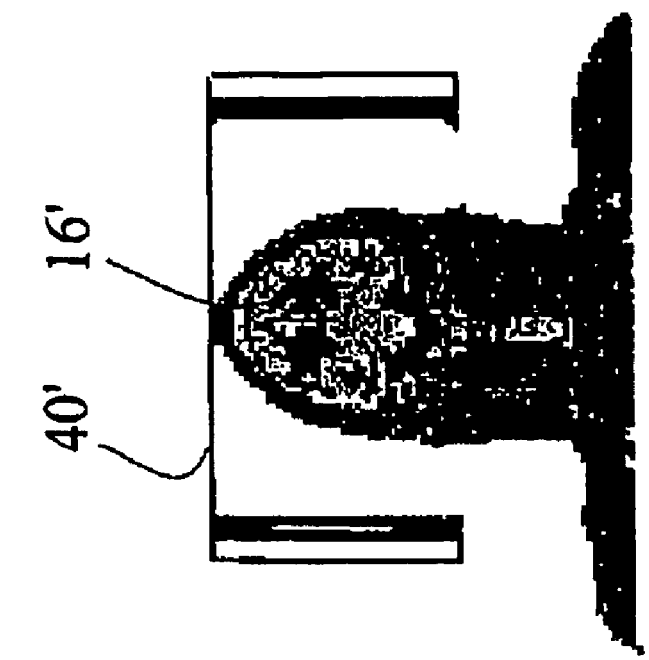
Figure 3B:
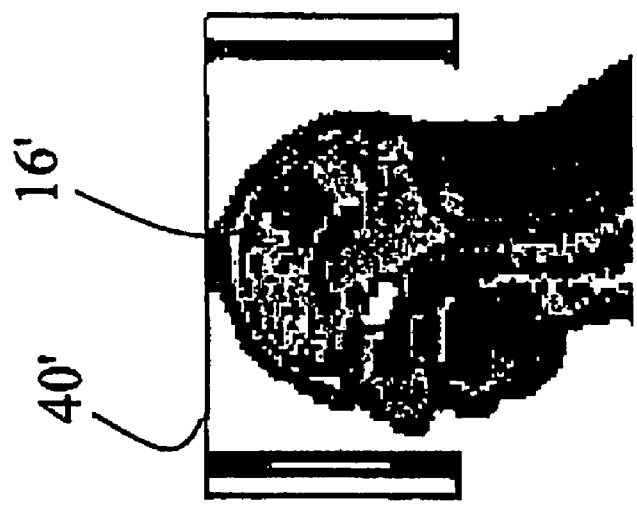
Figure 3C:
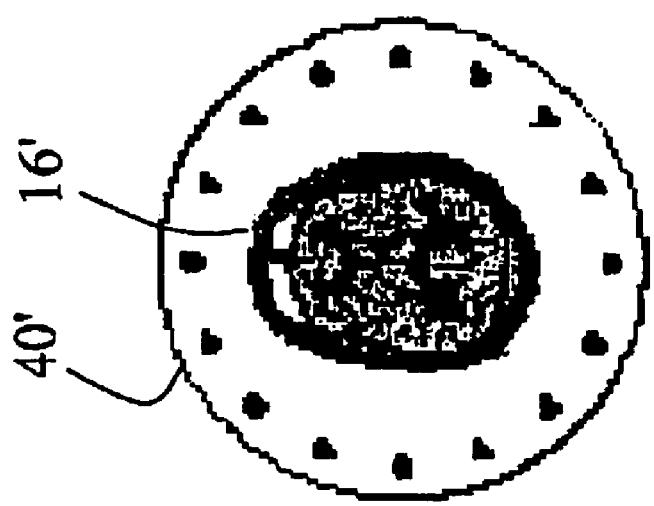

FIGS. 3A, 3B, and 3C show axial, sagittal, and coronal slices, respectively, of a TEM head coil model with a human head model disposed therein, for performing electromagnetic simulation of the $B_1$ field produced by the TEM head coil.

Figure 4:
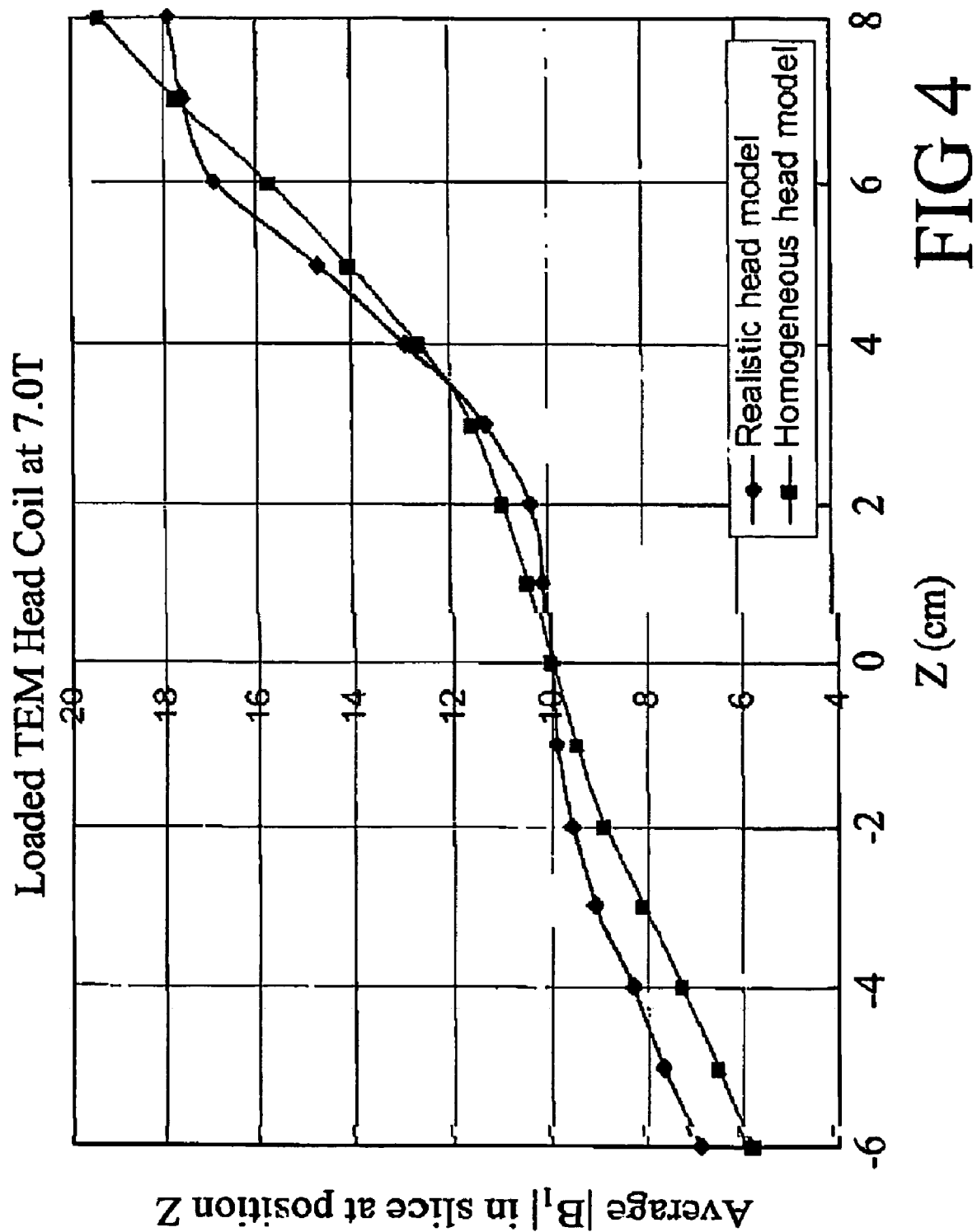

FIG. 4 plots the average $|B_1|$ field across a slice versus axial position z obtained using electromagnetic simulation of the model shown in FIGS. 3A, 3B, and 3C, and using electromagnetic simulation using the same head size but using averaged tissue properties.

FIG. 5 plots normalized $|B_1|$ field standard deviation in slice versus axial position z for the realistic head model of FIGS. 3A, 3B, and 3C, and for a head model with averaged tissue properties.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12. The main magnetic field coils 20 are shown simplified to a generally solenoidal configuration to produce a main $B_o$ magnetic field directed along a z-direction lying parallel to a central axis 22 of the scanner bore 14. The main magnetic field coils 20 are typically superconducting coils disposed inside in cryoshrouding 24, although resistive main magnets can also be used. Particularly at higher field strengths and therefore higher frequencies, superconducting magnets are preferred.

The housing 12 also houses or supports magnetic field gradient coils 30 for selectively producing magnetic field gradients along the z-direction, along in-plane directions transverse to the z-direction (such as along Cartesian x- and y-directions), or along other selected directions. The housing 12 also houses or supports radio frequency head or body coils 32 for selectively exciting and/or detecting magnetic resonances.

Although birdcage coils are common at 128 MHz and below, other coils besides a birdcage coil can be used as a volume transmit coil, such as a transverse electromagnetic (TEM) coil, a phased coil array, or other type of radio frequency coil. The housing 12 typically includes a cosmetic inner liner 36 defining the scanner bore 14. Instead of or in addition to the radio frequency coil 32, a local radio frequency transmit and/or transmit/receive coil such as an illustrated TEM head coil 40 can be employed.

The main magnetic field coils 20 produce a main magnetic field $B_o$ in a z-direction which is preferably at least 3.0 T, and more preferably greater than 3.0 T, such as 7.0 T or higher. A magnetic resonance imaging controller 44 operates magnet controllers 46 to selectively energize the magnetic field gradient coils 30 and operates a radio frequency transmitter 50 coupled to one or more of the radio frequency coils 32, 40 to selectively energize the radio frequency coil or coils 32, 40. By selectively operating the magnetic field gradient coils 30 and the one or more radio frequency coils 32, 40, magnetic resonance is generated and spatially encoded in at least a portion of a selected region of interest of the imaging subject 16. The magnetic resonance imaging controller 44 operates a radio frequency receiver 52 coupled to one or more of the radio frequency coils 32, 40 to receive magnetic resonance k-space data samples that are stored in a k-space memory 56.

A reconstruction processor 58 applies a suitable reconstruction algorithm such as a Fourier transform reconstruction algorithm to reconstruct the k-space samples into a reconstructed image including at least a portion of the region of interest of the imaging subject. The reconstructed image is stored in an image memory 60, displayed on a user interface 62, stored in non-volatile memory, transmitted over a local intranet or the Internet, or otherwise viewed, stored, manipulated, or so forth. The user interface 62 can also enable a radiologist, technician, or other operator of the magnetic resonance imaging scanner 10 to communicate with the magnetic resonance imaging controller 44 to select, modify, and execute magnetic resonance imaging sequences.

In one example imaging sequence, the TEM head coil 40 is energized by a radio frequency excitation to excite magnetic resonances of $^1H$ in the region of interest of the imaging subject 16. For an example main magnetic field $B_o$=7.0 T, the corresponding magnetic resonance frequency is $f_{res}=\gamma B_o$=298 MHz, where $\gamma \approx 42.58$ MHz/T is a proton gyrometric ratio. At this frequency, resonance signals have a wavelength in air of about one meter, but in the human head with an average permittivity of $\in_r$=40 the wavelength is $\lambda \approx 16$ cm, which is smaller than many typical imaging regions of interest During the radio frequency excitation, the magnetic field gradient coils 30 produce a slice-selective magnetic field gradient along the z-direction to select an axial slice or slab 66 that meets the resonance condition for excitation. Rather than selecting an axial slice, a coronal, sagittal, or otherwise-oriented slice can be selected using a suitably directed magnetic field gradient applied during the radio frequency excitation. The resonance signals from the selected slice are read out using a sequence of phase encode gradients applied along an in-slice phase encode direction, and readout gradients applied along an in-slice readout direction transverse to the phase-encode direction. In another suitable readout, in-slice magnetic field gradients are applied along selected angular directions transverse to the z-direction and spanning 180° or 360° of angular views. The slice or slab imaging sequence is repeated for a plurality of adjacent or spaced-apart slices to produce imaging data that is suitably reconstructed by the reconstruction processor 58 into volumetric or multi-slice reconstructed image data. The described imaging is only an example. Those skilled in the art can readily modify the described multi-slice sequence or construct other multi-slice imaging sequences that include features such as spin refocusing, an echo planar readout, contrast enhancement or selection mechanisms such as inversion recovery pre-pulses or the like, and so forth.

With reference to FIGS. 2A and 2B, the illustrated TEM head coil 40 includes a plurality of rungs 70. The rungs are shown on-end in phantom in FIG. 2A. Each rung 70 includes a copper tube 72 having a copper rod 74 inserted therein. In the illustrated TEM head coil 40, the position of each inserted copper rod 74 adjustable within the corresponding copper tube 72 to tune the resonance frequency of the TEM head coil 40. A generally cylindrical copper TEM radio frequency screen 76 surrounds the rungs. 70, and a copper end cap 78 is disposed at one end of the TEM head coil 40. In FIG. 2, Cartesian x-y-z coordinates are indicated corresponding to the spatial orientation of the TEM head coil 40 in the cylindrical scanner bore 14 shown in FIG. 1. It will be appreciated that the TEM head coil 40 can be used in other orientations; however, only the $B_1$ field transverse to the $B_o$ field generates signal.

FIGS. 3A, 3B, and 3C illustrate a finite difference time domain model for use in electromagnetic modeling of the TEM head coil 40 and the region of interest of the imaging subject 16 which includes the head and upper shoulders. The TEM head coil 40 is modeled by a TEM head coil model 40' illustrated in FIGS. 3A, 3B, and 3C, while the region of interest of the imaging subject 12 is modeled as a head model 16' illustrated in FIGS. 3A, 3B, and 3C. The human head model is based on a human body model that identifies distribution of tissues in the body. In FIGS. 3A, 3B, and 3C, various tissues of the human head are diagrammatically indicated by different shadings corresponding to differences in conductivity and permittivity characteristics.

Human body models and selected animal body models suitable for use in finite difference time domain electromagnetic modeling are available from a number of sources, such as from:

The United States Air Force Research Laboratory
Brooks Air Force Base, Tex.
http://www.brooks.af.mil/AFRL/HED/hedr/ and from:

The Visible Human Project
National Library of Medicine
Bethesda, Md.
http://www.nlm.nih.gov/research/visible/visible_human.html.

Suitable finite difference time domain electromagnetic modeling software can be obtained from some of these sources as well, or can be obtained as stand-alone modeling software packages into which the human body model 16' and the radio frequency coil model 40' are imported. Typically, finite difference time domain electromagnetic modeling operates on digital models such as pixel-based or voxel-based models of the imaging subject and the radio frequency coil. As an example, the human body models presently available from the United States Air Force Research Laboratory are voxel-based models having a $(1 \text{ mm})^3$ resolution. Those skilled in the art can measure and construct other models of human beings or other imaging subjects suitable for finite difference time domain electromagnetic modeling, and/or can use other numerical electromagnetic modeling algorithms besides finite difference time domain algorithms for the electromagnetic modeling. Suitable conductivity and dielectric data for various tissues of the human body at 298 MHz frequency (7.0 T main $B_o$ magnetic field) are provided in Table I. The source for values in Table I is the United States Air Force website http://www.brooks.af.mil/AFRL/HED/hedr/reports/dielectric.

TABLE I

Tissue conductivity and permittivity values at 298 MHz, and density for the human head model.

| Tissue Type | σ (S/m) | $\epsilon_r$ | ρ (kg/m³) |
|---|---|---|---|
| Blood | 1.690 | 58.442 | 1058 |
| Blood Vessel | 0.537 | 48.357 | 1040 |
| Body Fluid | 1.518 | 69.017 | 1010 |
| Bone (Cancellous) | 0.205 | 22.256 | 1920 |
| Bone (Cortical) | 0.096 | 14.103 | 1990 |
| Bone Marrow | 0.031 | 5.354 | 1040 |
| Cartilage | 0.552 | 46.808 | 1097 |
| Cerebral Spinal Fluid | 2.300 | 69.215 | 1007.2 |
| Eye (Cornea) | 1.025 | 56.465 | 1076 |
| Eye (Lens) | 0.495 | 46.910 | 1053 |
| Eye (Sclera) | 0.955 | 59.814 | 1026 |
| Eye (Aqueous Humor) | 1.518 | 69.017 | 1008.9 |
| Fat | 0.042 | 5.221 | 916 |
| Glands | 0.851 | 62.472 | 1050 |
| Ligaments | 0.700 | 53.045 | 1220 |
| Lung Inflated | 0.336 | 22.645 | 260 |
| Lung Deflated | 0.675 | 53.645 | 1050 |
| Lymph | 0.851 | 62.472 | 1040 |
| Mucous Membrane | 0.630 | 51.957 | 1040 |
| Muscle | 0.916 | 66.547 | 1046.85 |
| Nerve | 0.418 | 36.951 | 1038 |
| Brain Grey Matter | 0.824 | 58.397 | 1038 |
| Brain White Matter | 0.487 | 42.871 | 1038 |
| Cerebellum | 0.862 | 56.052 | 1038 |

TABLE I-continued

Tissue conductivity and permittivity values at 298 MHz, and density for the human head model.

| Tissue Type | σ (S/m) | $\epsilon_r$ | ρ (kg/m³) |
|---|---|---|---|
| Skin (Dry) | 0.534 | 43.797 | 1125 |
| Tooth | 0.082 | 13.446 | 2160 |
| Model Average | 0.551 | 40.058 | 1110.02 |

With reference returning to FIG. 1, the human head model 16' including tissue conductivity and dielectric values such as are given in Table I, the radio frequency coil model 40', and an input radio frequency pulse model 80 are input into an electromagnetic simulator 82 which implements the finite difference time domain electromagnetic modeling or other suitable electromagnetic modeling algorithm to compute the spatially dependent $B_1$ field 84 as a function of spatial position in two- or three-dimensions. For example, the $B_1(x,y,z)$ field is suitably calculated. The spatially dependent $B_1$ field computed by the electromagnetic simulator 82 is input to a radio frequency transmitter calibration processor 88 which computes, for example, the average $|B_1|$ value of the $B_1$ field across a slice to generate a per-slice radio frequency transmitter calibration 92.

With reference to FIGS. 4 and 5, radio frequency transmitter calibration data for the loaded TEM head coil 40 calculated using the TEM head coil model 40' and the human head model 16' are shown. FIG. 4 shows the average $|B_1|$ field in microtesla averaged over a slice as a function of axial slice position z. FIG. 5 shows the normalized $|B_1|$ field standard deviation in microtesla from a slice as a function of axial slice position z. Also shown in FIGS. 4 and 5 are the corresponding data for electromagnetic modeling of the loaded TEM head coil 40 using the TEM head coil model 40' and a homogeneous head model that uses an "average" tissue conductivity and permittivity for the entire head. In FIGS. 1, 4, and 5, axial slices along the z-direction, such as the illustrated slice 66, are considered; however, substantially similar processing can be employed for per-slice calibration of coronal, sagittal, or otherwise-oriented slices.

Preferably, the radio frequency transmitter calibration processor 88 also computes the average, position-dependent, and peak specific absorption rate (SAR) values from the simulated spatially dependent $B_1$ field 84. Table II compares average SAR (in units of W/kg) and peak SAR (that is, the maximum SAR averaged over 1-gram portions of tissue, or averaged over 10-gram portions of tissue) using the non-homogeneous, realistic human head model 16' and using the homogeneous head model that uses an "average" tissue conductivity and permittivity for the entire head.

TABLE II

Specific absorption rate (SAR) comparison for non-homogeneous human head model and homogeneous head model with same geometry. SAR is scaled to have average $|B_1|$ = 10 μT in the central transverse slice of the head model.

| 100% RF duty-cycle | SAR average over whole head model (W/kg) | SAR average over the head portion inside coil (W/kg) | Maximum SAR per 1-gram tissue (W/kg) | Maximum SAR per 10-gram tissue (W/kg) |
|---|---|---|---|---|
| Detailed head model | 89.4 | 129.5 | 831.3 | 415.0 |
| Homogeneous head model | 100.1 | 148.1 | 404.1 | 293.5 |

Table II shows one advantage of the non-homogeneous, realistic human head model 16' over the homogenous model: the simulated peak SAR values are more accurately calculated using the non-homogeneous model 16', since they account for local changes in SAR due to different tissue types, tissue masses, interfaces between tissue types, and so forth. In particular, the realistic human head model 16' identifies a factor of two larger peak SAR value for 1-gram tissue voxels compared with analogous modeling using the homogeneous head model.

In one approach for calibrating radio frequency transmissions, the radio frequency transmitter calibration processor 88 computes average and peak SAR values and adjusts the radio frequency calibration 92 or advises the user to adjust imaging sequence parameters such as echo time, flip angle, repeat time, or number of slices, to ensure that the computed average and peak SAR values satisfy relevant regulatory SAR limits 96 relating to maximum average and/or peak SAR values. For example, in the United States, the Food and Drug Administration (FDA) issues SAR safety regulations, while in much of Europe the International Electrotechnical Commission (IEC) regulations are applicable.

In a suitable approach which substantially maximizes the average field $|B_1|$ while satisfying the SAR regulatory limits 96, a target value for the per-slice average field $|B_1|$, or an associated parameter such as the associated flip angle, is selected. The radio frequency transmitter calibration processor 88 determines a suitable radio frequency excitation intensity for each slice that produces the desired average field $|B_1|$ in that slice. The calibration processor 88 also computes average SAR, peak SAR, or another relevant SAR value over the whole excited volume. If one or more of the computed SAR values exceeds one of the relevant SAR regulatory limits 96, the target value for the per-slice average field $|B_1|$ is reduced, or another imaging parameter affecting SAR is adjusted, and the computation is repeated until the SAR regulatory limits 96 are satisfied. This approach provides a correct average field $|B_1|$ across the slices while satisfying the safety limits imposed by the SAR regulatory limits 96.

During imaging, the magnetic resonance imaging controller 44 inputs a slice position 100 of the slice to be imaged, such as a z-axis position in the case of axial slices, to the radio frequency calibration 92, which then returns the radio frequency excitation intensity suitable for that slice. The magnetic resonance imaging controller 44 controls the radio frequency transmitter 50 to apply that excitation to the head coil 40 to excite or manipulate magnetic resonance in the imaging subject 12. The radio frequency calibration 92 is suitably arranged as a table of radio frequency excitations versus slice position, as an empirical fitted mathematical function, or the like derived from the simulated spatially dependent $B_1$ field 84.

Rather than using the electromagnetic simulator 82 to compute the spatially dependent $B_1$ field, a $B_1$ mapping can be acquired experimentally with the region of interest of the imaging subject 12 arranged in the head coil 40. A magnetic field map of each slice to be imaged is suitably generated by acquiring and reconstructing a $(\theta, 2\theta)$ pair of spin-echo images of the slice. A mapping processor 110 performs $B_1$ field mapping based on the $(\theta, 2\theta)$ pair of spin-echo images to generate a per-slice average $|B_1|$ v. z calibration 112. This may be performed for a number of subjects to derive a statistical average set of spatial $B_1$ maps for the human head. For imaging using sagittal, coronal, or otherwise-oriented slices, analogous suitable per-slice average $|B_1|$ calibrations are similarly generated. During imaging, the magnetic resonance imaging controller 44 accesses the per-slice average $|B_1|$ calibration 112 to determine a suitable radio frequency excitation intensity, and the magnetic resonance imaging controller 44 controls the radio frequency transmitter 50 to apply that excitation to the head coil 40.

Rather than performing the $B_1$ mapping on a human head, The $B_1$ map can be measured using a spatially non-uniform compartmentalized phantom model of at least the region of interest of the imaging subject disposed in the radio frequency coil. For example, a spatially non-uniform compartmentalized phantom model of a human head can be used to generate the per-slice average $|B_1|$ v. z calibration 112 for imaging a human head. The calibration 112 is suitably stored in tabular form and accessed by the magnetic resonance imaging controller 44 during imaging of an actual human head. Moreover, instead of using a $B_1$ mapping, a rapid magnetic resonance tip angle calibration can be acquired and used for the radio frequency transmitter calibration. A combination of these methods may also be used. The rapid tip angle calibration may be used to determine an initial calibration relationship between RF transmitter input level and actual average $B_1$ value achieved at a given slice position. This data set provides a reference level from which radio frequency transmitter input levels of the remaining slices are calculated based on the average $B_1$ values modeled or calculated for those slices.

The per-slice radio frequency intensity calibration has been described with reference to the illustrated TEM head coil 40 and for imaging using axial slices. However, the per-slice radio frequency calibration is readily applied to substantially any type of radio frequency coil, such as a birdcage coil, a phased coil array, a SENSE coil array, or the like, and is readily applied to head coils, whole body coils, local coils, and the like. Still further, the described per-slice radio frequency calibration is readily applied to any imaging slice orientation, such as a sagittal orientation, a coronal orientation, or a non-standard slice orientation.

In the illustrated embodiment, the $B_1$ field was characterized on a per-slice basis by an average $|B_1|$ value for the slice. That is, the $|B_1|$ field averaged over an area of interest of a slice served as the figure of merit for determining the radio frequency transmitter calibration 92. However, other figures of merit can be employed, such as a median $|B_1|$ value, or a root-mean-square $|B_1|$ value given by:

$$\text{Figure of merit} = \sqrt{\frac{\sum_N |B_1(x, y)|^2}{N}} \quad (1)$$

where in Equation (1), N is the number of slice pixels in the area of interest of the slice and the summation is performed over all N slice pixels. The slice pixels are designated by coordinates (x,y), although non-Cartesian coordinates can also be used.

Other statistical aggregations besides mean, median, average, or root-mean-square can be used. The area of interest that is aggregated may include the entire field of view of the slice, or the area of interest may include only those pixels exhibiting a magnetic resonance signal greater than a threshold value indicative of corresponding to human tissue, or the area of interest may be an area of pre-selected dimensions.

Although an aggregation figure-of-merit is typically preferred to approximately account for in-slice $B_1$ field variations, an unaggregated figure of merit, such as the $B_1$ field along the central axis of the coil with an accounting of the effects of the human head, can be used. An unaggregated figure-of-merit may have computational efficiency advantages.

When the volume defined by the areas of interest of the slices over which the figure of merit is calculated is less than the total excited volume of the imaging subject, the average and peak SAR values are preferably computed with respect to the total excited volume of the imaging subject to ensure that the SAR does not exceed the regulatory SAR limits 96 anywhere in the imaging subject.

Moreover, the figure of merit can be the spatially varying $B_1$ field, for example, the total range of $B_1$ field amplitude over a slice, and the radio frequency pulse shape 80 can be an adiabatic pulse that is adjusted based on the spatially varying $B_1$ field figure of merit such that the adiabatic pulse substantially flattens the in-slice spatial variations in the resulting flip angles. The amplitude and other characteristics of the adiabatic pulse are also adjusted such that the substantially flattened flip angles are substantially similar for each slice. In this case, the SAR calculation should be performed for each adiabatic pulse to ensure that no slice excitation adiabatic pulse will produce an SAR that exceeds the regulatory limits 96.

In one embodiment suitable for multi-stage imaging methods such as magnetic resonance angiographic peripheral run off studies or whole body scanning/screening studies, the imaging subject 16 is moved axially, that is, transverse to the acquired slice or slices, continuously or in discrete steps through the bore 14 along the bore axis 22. Imaging is repeatedly performed at a selected bore slice position along the bore 14 or over a volume slab of bore slices to perform multi-slice magnetic resonance imaging. In this embodiment, the position of the imaged bore slice or slab of bore slices is referenced to the bore 14 and does not change; however, as the imaging subject 16 is moved axially the portion of the subject 16 coinciding with the selected bore slice or slab of bore slices does change.

In such multi-stage imaging methods, the per-slice $B_1$ field calibration can be repeated for the selected stationary bore slice each time the imaging subject is moved, to account for changes in the $B_1$ field characteristics of the stationary bore slice caused by the different portion of the imaging subject coinciding therewith. Each per-slice $B_1$ field calibration can be adjusted based on the previous bore slice calibration, since the change in $B_1$ field characteristics of the selected bore slice due to gradual or small-step motion of the imaging subject is typically small. In the case of continuous axial subject motion, each per-slice $B_1$ calibration computation can be timed so that the calibration is performed for a slice of the imaging subject 16 that will coincide with the selected bore slice at the time of the next slice data acquisition.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging method for performing multi-slice magnetic resonance imaging of a region of interest of an associated imaging subject using a radio frequency coil arranged to generate a $B_1$ magnetic field in the region of interest, the method comprising:

determining a per-slice $B_1$ field strength value for each slice that is representative of the $B_1$ field strength over a selected area of the slice;

determining an adjusted per-slice radio frequency excitation intensity for each slice that adjusts the $B_1$ field strength value for the slice to a selected $B_1$ field strength value;

acquiring magnetic resonance imaging data for each slice using the adjusted per slice radio frequency excitation intensity for that slice; and reconstructing the acquired magnetic resonance imaging data into a reconstructed image representation.

2. The method as set forth in claim 1, wherein the determining of a per slice $B_1$ field strength value for each slice comprises:

determining the $B_1$ field strength across at least the selected area of the slice; and computing an aggregate value of the determined $B_1$ field strength across the selected area of the slice.

3. The method as set forth in claim 2, wherein the computing of an aggregate value comprises:

computing an average, median, or root mean square value of the determined $B_1$ field strength across the selected area of the slice.

4. The method as set forth in claim 2, wherein the determining of the $B_1$ field strength across at least the selected area of the slice comprises:

measuring a $B_1$ map of at least the selected area of the slice with one of (1) the region of interest of the imaging subject disposed in the radio frequency coil, (2) the region of interest of a representative distribution of imaging subjects acquired a priori in the radio frequency coil, and (3) a spatially non-uniform compartmentalized phantom model of at least the region of interest of the imaging subject disposed in the radio frequency coil.

5. The method as set forth in claim 1, wherein the adjusted per-slice radio frequency excitation intensities are adiabatic radio frequency excitation intensities, and the determining of the adjusted adiabatic radio frequency intensities comprise:

for each slice, computing an adjusted adiabatic radio frequency excitation intensity that substantially corrects for a variation of the $B_1$ field strength across the selected area of the slice to provide more uniform flip angles.

6. A magnetic resonance imaging method for performing multi-slice magnetic resonance imaging of a region of interest of an associated imaging subject using a radio frequency coil arranged to generate a $B_1$ magnetic field in the region of interest, the method comprising:

determining a per-slice $B_1$ field value for each slice that is representative of the $B_1$ field over a selected area of the slice by computing the $B_1$ field numerically using a model of the radio frequency coil and a non-homogeneous model of the imaging subject, the non-homogeneous model of the imaging subject employing different conductivity and permittivity values for different materials of which the imaging subject is formed, and computing an aggregate value of the numerically computed $B_1$ field across the selected area of the slice;

determining an adjusted per-slice radio frequency excitation for each slice that adjusts the $B_1$ field value for the slice to a selected value;

acquiring magnetic resonance imaging data for each slice using the adjusted per slice radio frequency excitation for that slice; and reconstructing the acquired magnetic resonance imaging data into a reconstructed image representation.

7. The method as set forth in claim 6, wherein the non-homogeneous model of the imaging subject is a non-homogeneous model of at least a portion of a human imaging subject, the model employing different conductivity and permittivity values for different types of tissue.

8. A magnetic resonance imaging method for performing multi-slice magnetic resonance imaging of a region of interest of an associated imaging subject using a radio frequency coil arranged to generate a $B_1$ magnetic field in the region of interest the method comprising:

determining a value of a $B_1$ field figure of merit for each slice that is representative of the $B_1$ field over a selected area of the slice;

determining an adjusted per-slice radio frequency excitation for each slice that adjusts the $B_1$ field figure of merit for the slice to a selected value;

acquiring magnetic resonance imaging data for each slice using the adjusted per slice radio frequency excitation for that slice; and reconstructing the acquired magnetic resonance imaging data into a reconstructed image representation.

9. method as set forth in claim 8, wherein the determining of an adjusted per-slice radio frequency excitation for each slice comprises:

determining an adjusted radio frequency excitation for each slice that adjusts the $B_1$ field figure of merit to a selected value of the $B_1$ field figure of merit that is substantially the same for a plurality of slices for which imaging data is acquired.

10. A magnetic resonance imaging method for performing multi-slice magnetic resonance imaging of a region of interest of an associated imaging subject using a radio frequency coil arranged to generate a $B_1$ magnetic field in the region of interest, the method comprising:

determining a per-slice $B_1$ field value for each slice that is representative of the $B_1$ field over a selected area of the slice;

determining an adjusted per-slice radio frequency excitation for each slice that adjusts the $B_1$ field value for the slice to a selected value that is substantially the same for a plurality of slices for which imaging data is acquired;

determining a specific absorption rate based on the adjusted per-slice radio frequency excitations;

conditional upon the determined specific absorption rate exceeding a regulatory safety limit, repeating the determining of an adjusted per-slice radio frequency excitation for each slice using one of a lower selected value of the per-slice $B_1$ field value and adjustment of at least one other imaging sequence parameter to reduce the specific absorption rate;

acquiring magnetic resonance imaging data for each slice using the adjusted per slice radio frequency excitation for that slice; and reconstructing the acquired magnetic resonance imaging data into a reconstructed image representation.

11. A magnetic resonance imaging method for performing multi-slice magnetic resonance imaging of a region of interest of an associated imaging subject using a radio frequency coil arranged to generate a $B_1$ magnetic field in the region of interest, the method comprising:

determining a per-slice $B_1$ field value for each slice that is representative of the $B_1$ field over a selected area of the slice;

determining an adjusted per-slice radio frequency excitation for each slice that adjusts the $B_1$ field value for the slice to a selected value;

acquiring magnetic resonance imaging data for each slice using the adjusted per slice radio frequency excitation for that slice;

reconstructing the acquired magnetic resonance imaging data into a reconstructed image representation; and moving the associated imaging subject in a direction transverse to the slices, the determining of a per-slice $B_1$ field value, the determining of an adjusted per-slice radio frequency excitation, and the acquiring of magnetic resonance imaging data being repeated for a stationary slice position with the imaging subject moved relative to the stationary slice position between each repetition.

12. The method as set forth in claim 11, wherein the moving of the associated imaging subject is one of:

in discrete steps, with the subject motionless during each repetition of the acquiring, and continuous, with the subject moving during each repetition of the acquiring.

13. A magnetic resonance imaging apparatus comprising:

a main magnetic field coil generating a main magnetic field;

magnetic field gradient coils selectively generating magnetic field gradients;

a radio frequency coil arranged to generate a $B_1$ magnetic field in a region of interest of an associated imaging subject;

a radio frequency transmitter selectively energizing the radio frequency coil;

a radio frequency receiver selectively sampling the radio frequency coil; and a processor programmed to perform the method of claim 1.

14. A magnetic resonance imaging apparatus for performing multi-slice magnetic resonance imaging of a region of interest of an associated imaging subject, the apparatus comprising:

a radio frequency coil arranged to generate a $B_1$ magnetic field in the region of interest;

a means for determining a per-slice $B_1$ field value for each slice that is representative of the $B_1$ field over a selected area of the slice, the determining means comprising at least one of:

an electromagnetic simulator receiving a digital model of the region of interest and a digital model of the radio frequency coil and estimating the $B_1$ field generated across the region of interest, the digital model of the region of interest mimicking non-uniform dielectric and conductivity properties of the region of interest; and a table of adjusted per-slice radio frequency excitation versus slice position derived from the per-slice $B_1$ field values;

a means for determining an adjusted per-slice radio frequency excitation for each slice that adjusts the $B_1$ field value for the slice to a selected value;

a magnetic resonance imaging scanner configured to acquire magnetic resonance imaging data for each slice using the adjusted per-slice radio frequency excitation for that slice; and a reconstruction processor configured to reconstruct the acquired magnetic resonance imaging data into a reconstructed image representation.

15. The apparatus as set forth in claim 14, wherein the means for determining a per-slice $B_1$ field value for each slice comprises said electromagnetic simulator receiving the digital model of the region of interest and the digital model of the radio frequency coil and estimating the $B_1$ field generated across the region of interest, the digital model of the region of interest mimicking non-uniform dielectric and conductivity properties of the region of interest.

16. The apparatus as set forth in claim 15, wherein the electromagnetic simulator employs a finite difference time domain algorithm.

17. The apparatus as set forth in claim 14, wherein the means for determining a per-slice $B_1$ field value for each slice comprises:

a means for determining a value of a figure of merit for each slice that is representative of the $B_1$ field over a selected area of the slice.

18. The apparatus as set forth in claim 17, wherein the means for determining a value of a per-slice $B_1$ field figure of merit for each slice that is representative of the $B_1$ field over a selected area of the slice comprises:

a statistical aggregation means for calculating an aggregate value representative of the $B_1$ field over the selected area of the slice.

19. The apparatus as set forth in claim 14, wherein the means for determining an adjusted per-slice radio frequency excitation for each slice comprises said table of adjusted per-slice radio frequency excitation versus slice position derived from the per-slice $B_1$ field values.

20. The apparatus as set forth in claim 14, further comprising:

a means for determining a specific absorption rate based on the adjusted per-slice radio frequency excitations; and conditional upon the determined specific absorption ratio exceeding a regulatory safety limit, repeating the determining of an adjusted per-slice radio frequency excitation for each slice using one of lower selected values of the per-slice $B_1$ field value and adjustment of at least one other imaging sequence parameter to reduce the specific absorption rate.

* * * * *